United States Patent
Goto et al.

(10) Patent No.: US 11,456,156 B2
(45) Date of Patent: Sep. 27, 2022

(54) CHARGED PARTICLE BEAM APPARATUS

(71) Applicant: NuFlare Technology, Inc., Yokohama (JP)

(72) Inventors: Keisuke Goto, Kamakura (JP); Kiyoshi Nakaso, Sunto-gun (JP)

(73) Assignee: NuFlare Technology, Inc., Yokohama (JP)

( * ) Notice: Subject to any disclaimer, the term of this patent is extended or adjusted under 35 U.S.C. 154(b) by 155 days.

(21) Appl. No.: 15/930,828

(22) Filed: May 13, 2020

(65) Prior Publication Data
US 2020/0365368 A1 Nov. 19, 2020

(30) Foreign Application Priority Data

May 14, 2019 (JP) .............................. JP2019-091529

(51) Int. Cl.
*H01J 37/32* (2006.01)
*H01J 37/244* (2006.01)

(52) U.S. Cl.
CPC ........ *H01J 37/3233* (2013.01); *H01J 37/244* (2013.01); *H01J 37/32935* (2013.01)

(58) Field of Classification Search
CPC ...... H01J 37/244; H01J 37/268; H01J 37/304; H01J 37/3174; H01J 37/3233; H01J 37/32935
See application file for complete search history.

(56) References Cited

U.S. PATENT DOCUMENTS

| 5,523,576 | A | 6/1996 | Koike et al. | |
|---|---|---|---|---|
| 7,184,128 | B2 * | 2/2007 | Tegenbosch | G03F 7/70716 355/72 |
| 2004/0119022 | A1 * | 6/2004 | Sato | H01J 37/153 250/396 R |
| 2005/0205809 | A1 * | 9/2005 | Uchida | B82Y 10/00 250/442.11 |
| 2006/0033037 | A1 * | 2/2006 | Kawasaki | H01J 37/1478 250/398 |
| 2008/0251718 | A1 * | 10/2008 | Kaga | G01N 23/203 250/310 |
| 2014/0312246 | A1 * | 10/2014 | Takahashi | H01L 21/68 250/453.11 |
| 2016/0307726 | A1 * | 10/2016 | Hatakeyama | H01J 37/265 |

FOREIGN PATENT DOCUMENTS

JP 6-326009 A 11/1994

* cited by examiner

*Primary Examiner* — Tung X Le
(74) *Attorney, Agent, or Firm* — Oblon, McClelland, Maier & Neustadt, L.L.P.

(57) ABSTRACT

According to an embodiment, a charged particle beam apparatus includes a stage; a chamber; an emission source of the charged particle beam; an electronic optical system configured to emit the charged particle beam; an optical column including the emission source and the electronic optical system; a charged particle detector configured to detect a position of the charged particle beam; a first actuator configured to provide a frequency vibration to the stage based on a first excitation signal; a second actuator configured to provide a frequency vibration to the optical column based on a second excitation signal; a third actuator configured to provide a frequency vibration to the chamber based on a third excitation signal; and a controller configured to generate the first to third excitation signals.

20 Claims, 5 Drawing Sheets

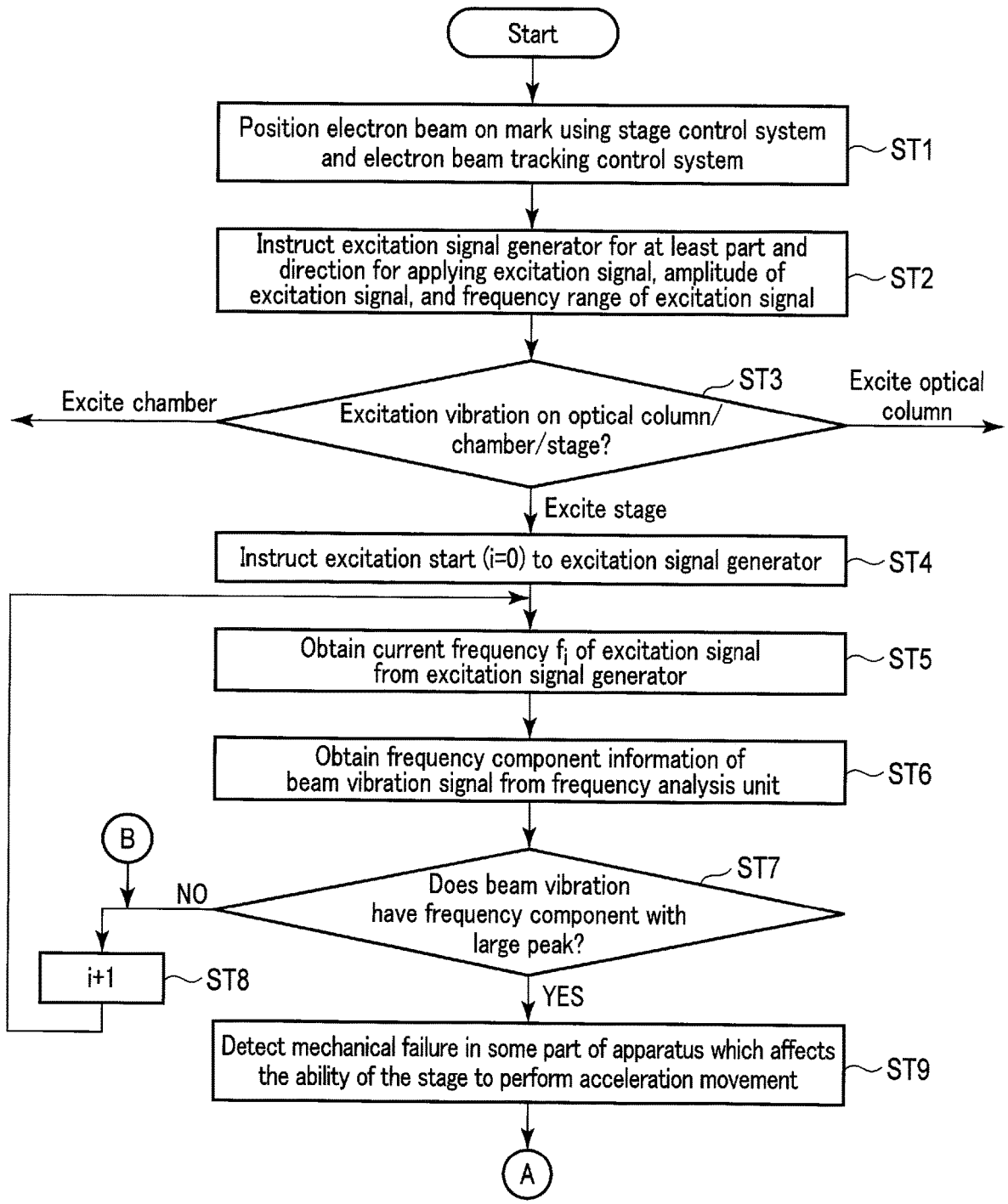
F I G. 3A

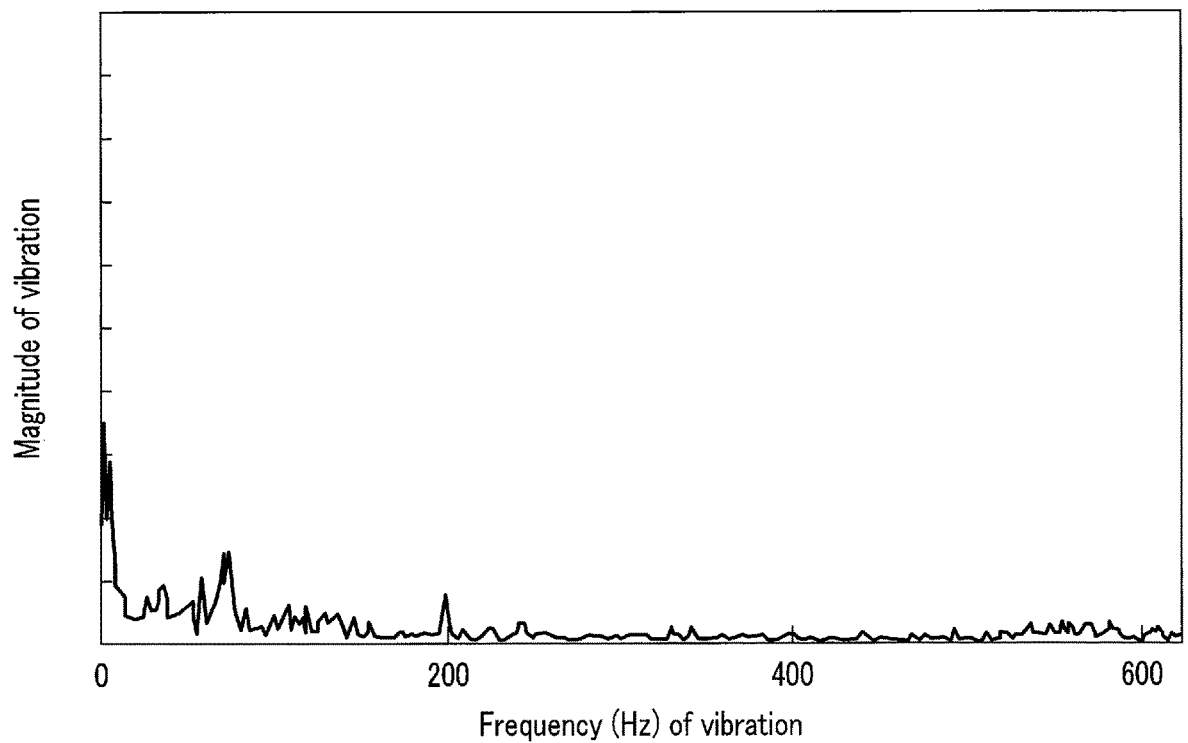
F I G. 4
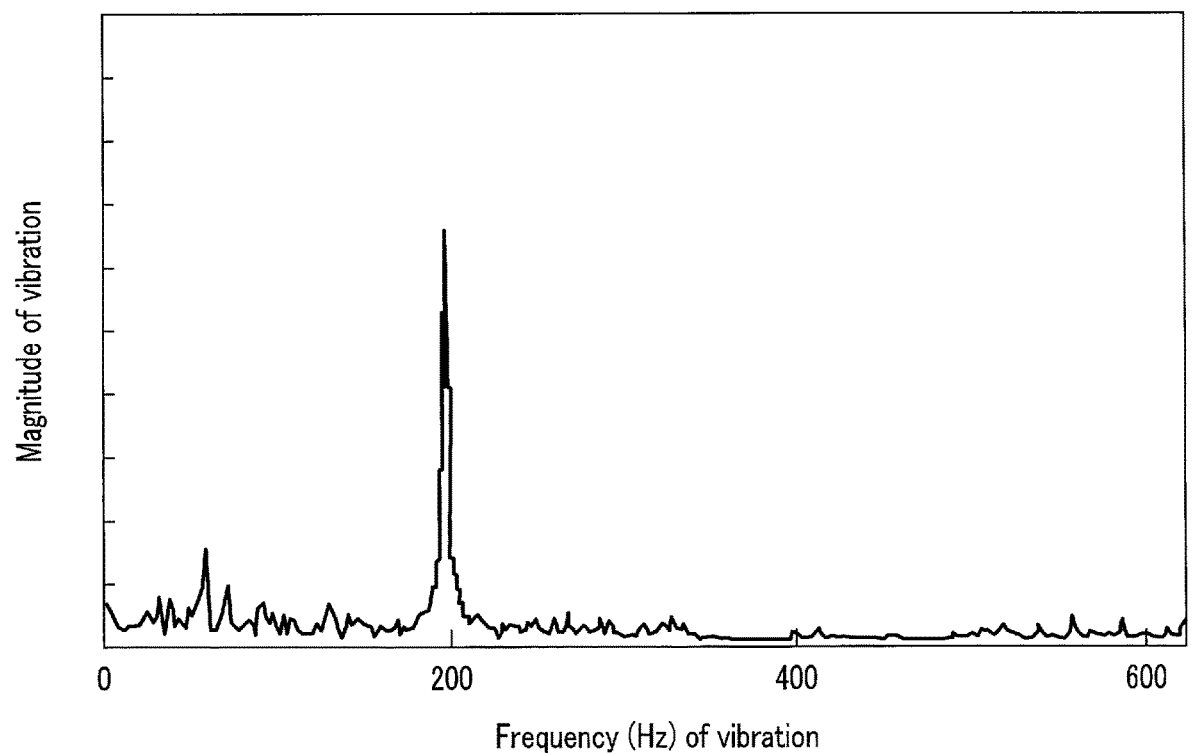
F I G. 5

CHARGED PARTICLE BEAM APPARATUS

CROSS-REFERENCE TO RELATED APPLICATIONS

This application is based upon and claims the benefit of priority from prior Japanese Patent Application No. 2019-091529, filed May 14, 2019; the entire contents of which are incorporated herein by reference.

FIELD

The embodiment of the present invention relates generally to a charged particle beam apparatus for irradiating a charged particle beam, such as an electron beam, to an object.

BACKGROUND

A writing apparatus using a charged particle beam, such as an electron beam, is used for the purpose of writing a predetermined pattern on a semiconductor substrate, such as a silicon wafer. In addition, the writing apparatus using a charged particle beam is used for the purpose of writing a predetermined pattern on a mask substrate, which is in turn used for exposing a pattern on a semiconductor substrate. Furthermore, with an inspection apparatus for checking defects of a pattern written on an object, such as a mask substrate or a semiconductor substrate, the writing apparatus using a charged particle beam is used to obtain an image of the object by irradiating the object with the charged particle beam. Examples of a charged particle beam apparatus include such a writing apparatus, and inspection apparatus using charged particle beams. In the following, the object irradiated with charged particle beams, such as a semiconductor substrate or a mask substrate, is called a "sample."

In recent years, miniaturization of a circuit pattern in semiconductor apparatuses has become prominent with the advancement of integration. In order to achieve miniaturization of circuit patterns, it is necessary to suppress the degradation in writing precision of charged particle beams used by a charged particle beam apparatus.

For example, a charged particle beam writing apparatus comprises a chamber, a stage on which to place a sample, a drive mechanism for moving the stage, a charged particle beam irradiation mechanism, and an optical column. The stage is provided in the chamber. The charged particle beam irradiation mechanism is provided in the optical column. The optical column is directly or indirectly supported by the chamber. Furthermore, the charged particle beam irradiation mechanism comprises an electron gun for generating charged particle beams, an aperture for forming a charged particle beam into a predetermined shape, and an illumination-lens system for converging the charged particle beam on the sample. In addition, the charged particle beam writing apparatus writes a predetermined pattern on the sample by continuously moving the stage that carries the sample thereon. The charged particle beam writing apparatus corrects an irradiation position so that a relative position between the charged particle beam and the sample will not vary. More specifically, the charged particle beam writing apparatus obtains position information of the sample by measuring the position of the stage using a laser length measurement system. The charged particle beam writing apparatus corrects the irradiation position by deflecting the charged particle beam based on the position information. Such correction of the irradiation position of the charged particle beam is generally called a "tracking correction."

During tracking correction, the relative position between the charged particle beam and the sample varies due to various vibrations. The types of vibrations include vibrations caused by a force applied to the stage from a stage control mechanism for keeping the stage at a predetermined position, vibrations caused by a pump for maintaining a vacuum inside the chamber and optical column, vibrations caused in the chamber, stage or optical column due to the effect of the reaction force against a force caused by the stage performing acceleration movement within the chamber (for example, mass×acceleration of stage) etc. It is not always the case that all variations of the relative position between the charged particle beam and the sample can be suppressed by the tracking correction. The tracking correction uses, for example, a laser length measurement system configured by a laser light source, a mirror provided on a stage for reflecting the laser, and a light receiver for detecting laser light reflected at the mirror, and so on. A mechanical failure often occurs in the laser length measurement system (for example, distortion of the laser light source, mirror or light receiver, or a loose attachment of these components). In such a case, the measured position information of the sample would include an error originating in a failure. Thus, it is difficult to correct the variation of the relative position between the charged particle beam and the sample by the tracking correction.

Generally, the variation of the relative position between a charged particle beam and a sample which cannot be corrected by tracking correction is evaluated by examining a pattern which is actually written on the sample. However, as considerable time is required to actually write the pattern on the sample and process the pattern written to allow for detection (for example, developing the mask substrate written with the pattern), such an evaluation is expected to take several days.

A method for examining a factor of variation of the relative position between a charged particle beam and a sample without actually writing a pattern on the sample is described in, for example, Jpn. Pat. Appln. KOKAI Publication No. H6-326009.

However, as mentioned above, various mechanisms comprised by the charged particle beam writing apparatus (for example, the chamber, stage, optical column, and laser length measurement system) may be at a vibrated state, such as the vibration caused by the acceleration movement of the stage where the sample is placed. In this case, it is important to evaluate how such vibration affects the variation of relative positions between the charged particle beam and the sample. A charged particle beam writing apparatus capable of performing this evaluation in a short period without actually writing the pattern is desired.

In addition, an inspection apparatus which uses a charged particle beam also comprises an optical column, chamber, stage, etc. which have a similar mechanism as that of the charged particle beam writing apparatus. In the inspection apparatus as well, suppression of the variation of the relative position between the charged particle beam and the sample is required.

SUMMARY

According to an embodiment, a charged particle beam apparatus comprises: a stage on which an object irradiated with a charged particle beam is to be placed, and which is configured to move; a chamber for storing the stage; an emission source of the charged particle beam; an electronic optical system configured to emit the charged particle beam from the emission source to the stage; an optical column including the emission source and the electronic optical system; a charged particle detector configured to detect a position of the charged particle beam irradiated from the electronic optical system; a first actuator configured to provide a frequency vibration to the stage based on a first excitation signal; a second actuator configured to provide a frequency vibration to the optical column based on a second excitation signal; a third actuator configured to provide a frequency vibration to the chamber based on a third excitation signal; and a controller configured to generate the first to third excitation signals.

BRIEF DESCRIPTION OF THE DRAWINGS

FIG. 3A is a flowchart indicating an operation flow for detecting a presence of a mechanical failure within the electron beam writing apparatus according to one embodiment.

FIG. 4 shows a frequency component for one example of a relative vibration between the electron beam and the stage.

FIG. 5 shows a frequency component for another example of a relative vibration between the electron beam and the stage.

DETAILED DESCRIPTION

Hereinafter, embodiments of the present invention will be described with reference to the accompanying drawings.

Figure 1:
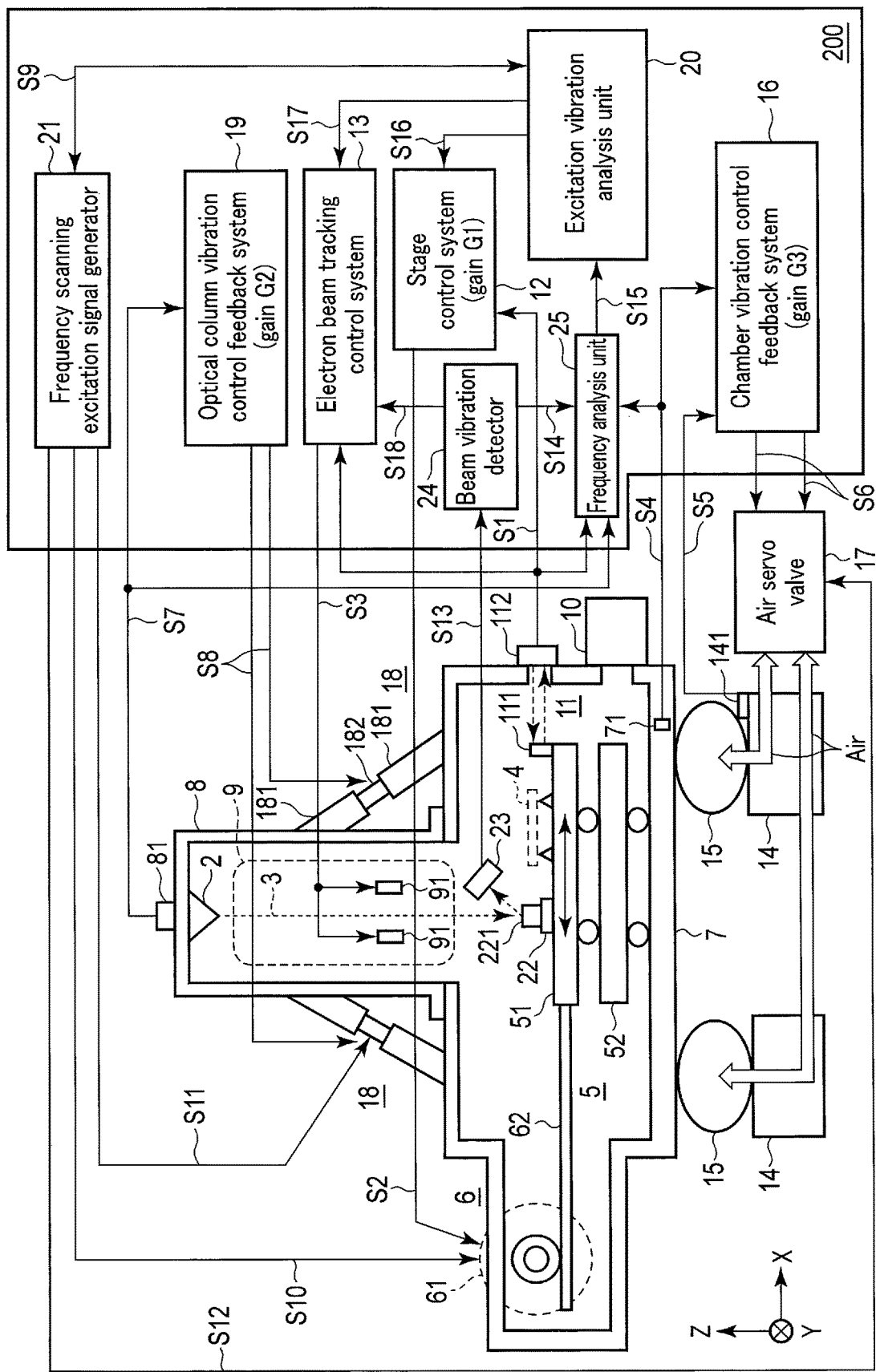
FIG. 1 is a schematic view of a configuration of an electron beam writing apparatus according to one embodiment.

FIG. 1 is a schematic view of a configuration of an electron beam writing apparatus 1 according to one embodiment. In this embodiment, the electron beam writing apparatus 1 is one example of a charged particle beam apparatus implemented by the present invention.

The electron beam writing apparatus 1 is an apparatus for manufacturing a mask substrate (or a reticle) used for exposing a pattern on a silicon wafer in a manufacturing process of a semiconductor device. In the electron beam writing apparatus 1, a desired pattern is written on a mask substrate 4 by irradiating an electron beam 3 from an electron gun 2 on the mask substrate 4. The electron beam writing apparatus 1 may be an apparatus for exposing a pattern on a silicon wafer. By replacing the electron gun 2 with an emission source of a charged particle beam, this embodiment can be applied to a charged particle beam writing apparatus.

The electron beam writing apparatus 1 comprises a stage 5 for placing the mask substrate 4. The stage 5 is constituted to be movable in a predetermined direction. As a result, the stage 5 can change the relative position between the electron beam 3 and the mask substrate 4 to write a pattern on an entire surface of the mask substrate 4. FIG. 1 shows an X-stage 51 configured to move back and forth along an X-direction, and a Y-stage 52 configured to move back and forth along a Y-direction (direction orthogonal to the X-direction). The stage 5 also includes a Z-stage movable along a Z-direction (direction orthogonal to the X-direction and Y-direction) above the X-stage 51, which is not illustrated for simplification purposes. The mask substrate 4 is actually supported by a mask-holding mechanism provided on the Z-stage. For simplification purposes, the Z-stage and the holding mechanism is not shown in FIG. 1. The electron beam writing apparatus 1 comprises drive mechanisms for respectively moving the X-stage 51, Y-stage 52 and Z-stage. FIG. 1 only shows a drive mechanism 6 for moving the X-stage 51 out of all the drive mechanisms for simplification purposes. The drive mechanism 6 comprises a motor, air bearings, etc. For example, the drive mechanism 6 for moving the X-stage 51 in the X-direction comprises a motor 61, and a rod 62 connected to the motor 61 and the X-stage 51. The rod 62 moves back and forth in the X-direction by the rotation of the motor 61. The X-stage 51 moves in the X-direction by the movement of the rod 62. The electron beam writing apparatus 1, for example, comprises a drive mechanism with a similar configuration as the drive mechanism 6 in order to move the Y-stage 52 along the Y-direction. Further, a drive mechanism (actuator) is provided for moving the Z-stage along the Z-direction. The stage 5 is movable in the X-direction, Y-direction, and Z-direction with respect to the electron beam 3.

The stage 5 is provided in a chamber 7. An optical column 8 having the electron gun 2 and an electronic optical system 9 in the interior is provided on the chamber 7. The chamber 7 and the optical column 8 forms a sealed internal space. Though the details are not shown in FIG. 1, the electronic optical system 9 for shaping the electron beam 3 emitted from the electron gun 2 into a predetermined cross section and irradiating it to the mask substrate 4 is provided in the optical column 8. The electronic optical system 9 comprises an irradiation optical system for guiding the electron beam 3 having been emitted from the electron gun 2 to subsequent optical systems, a projection optical system for shaping the cross section of the electron beam 3, and an object optical system for irradiating the shaped electron beam 3 to a predetermined position on the mask substrate 4. The electronic optical system 9 is configured using an electronic lens, aperture, deflectors, etc. FIG. 1 schematically shows deflectors 91 provided to control the hereinafter-described tracking of the electron beam 3. FIG. 1 shows one electron beam 3; however, the electronic optical system 9 may be constituted so that multiple beams each used for writing partial patterns on the mask substrate 4 are irradiated.

The sealed space formed by the chamber 7 and the optical column 8 is set to a vacuum state for the purpose of avoiding interference between gas molecules in air and the electron beam 3, to protect the electron gun 2 which rises its temperature, and so on. Thus, the electron beam writing apparatus 1 comprises an exhaust mechanism 10 for exhausting gas inside the chamber 7 and optical column 8. A vacuum pump, such as a turbo molecule pump, is used for the exhaust mechanism 10. An exhaust pipe may be provided between the vacuum pump and chamber 7. The vacuum pump is a vibration source since the pump is constantly moving for exhaust purposes. If the attachment of the pipe is loose, the vibration of the vacuum pump will cause the vibration of the chamber 7 or the optical column 8.

The electron beam writing apparatus 1 further comprises laser length measurement mechanisms for measuring a position of the stage 5. FIG. 1, for simplification, schematically shows only a laser length measurement device 11 for measuring a position in the X-direction of the stage 5 out of all the laser length mechanisms. The electron beam writing apparatus 1 comprises a similar laser length measurement mechanism for measuring the position in the Y-direction of the stage 5. The laser length measurement device 11 comprises a mirror 111, an interferometer 112 for measuring a distance based on a phase of laser light reflected at the mirror 111. The laser light source for generating laser light, or a configuration for forming an optical path for irradiating the laser light towards the mirror 111 is not shown in the drawings in order to simplify the explanation. The mirror 111 is fixed to the stage 5. The mirror 111 is actually a component provided at the Z-stage in each of the X-direction and Y-direction; however, in FIG. 1, the mirror 111 is schematically shown as being fixed to the X-stage 51. The interferometer 112 is fixed to a side wall of the chamber 7. Thus, the interferometer 112 obtains position information of the stage 5 by measuring a distance between the sidewall of the chamber 7 and the stage 5. If the attachment of the mirror 111 to the stage 5 is loose, there is a possibility that the mirror 111 will tremble by the vibration of the stage 5. Similarly, if the attachment of the interferometer 112 to the chamber 7 is loose, there is a possibility that the interferometer 112 will tremble or chatter as a result of the vibration of the chamber 7. The trembling of the mirror 111 or the interferometer 112 causes an error in the distance measured by the laser length measurement device 11. The trembling of the mirror 111 or the interferometer 112 can be easily observed when stage 5 performs acceleration movement. More specifically, the trembling of the mirror 111 or the interferometer 112 can be easily observed when an inertial force is applied to the mirror 111, or the chamber 7 receives a reaction force against the inertial force caused at the stages 51 and 52. It is difficult to find a mechanical failure of the mirror 111 or the interferometer 112 when the stage 5 is stationary or moving at a constant velocity since force is not applied to the mirror 111 or the interferometer 112.

The position information of the stage 5 measured by the laser length measurement device 11 is provided to a stage control system 12 of a controller 200 as a position information signal S1. The stage control system 12 generates a drive signal S2 for the motor 61 based on the obtained position information of the stage 5. The drive signal S2 is provided to the motor 61 for controlling the rotation of the motor 61. For example, when the stage 5 moves to a certain position, the stage control system 12 provides the drive signal S2 to the motor 61 to move the stage 5 only for a distance covering the difference between the current position and the desired position, in a direction towards the desired position from the current position of the stage 5. The rotational direction, rotational speed and rotational amount (time) of the motor 61 are controlled by the drive signal S2. The stage control system 12 continuously receives the position information of the stage 5 from the interferometer 112 during the period (time) of moving the stage 5 to a desired position. Therefore, the stage control system 12 obtains the velocity of the stage 5 by differentiating a positional change (distance) of the stage 5 with respect to time. The stage control system 12 also obtains acceleration of the stage 5 by twice differentiating the positional change of the stage 5 with respect to time. The stage control system 12 accordingly controls the velocity of the stage 5 to be a target velocity by providing the drive signal S2, which makes the difference between the current velocity of the stage 5 and the target velocity zero, to the motor 61. Similarly, the stage control system 12 controls the acceleration of the stage 5 to be a target acceleration by providing the drive signal S2, which makes the difference between the current acceleration of the stage 5 and the target acceleration zero, to the motor 61. In addition, the stage control system 12 can position the stage 5 to a target position by providing the drive signal S2, which makes the difference between the current position of the stage 5 and the target position zero, to the motor 61. The position, velocity and acceleration of the stage 5 correspond to the position, velocity and acceleration of the mask substrate 4 mounted on the stage 5.

A gain G1 of the stage control system 12 is a value exemplifying the response characteristics or responsiveness of a controlled amount (position or motion of the stage 5 introduced by the motor 61 in accordance with the drive signal S2) to the input amount (for example, the difference between the current position and target position, difference between the current velocity and target velocity, and the difference between the current acceleration and target acceleration). When the gain G1 of the stage control system 12 is large, the controlled amount significantly changes, even with a slight change in the input amount. Therefore, the stage control system 12 can control the stage 5 so that the controlled amount will quickly reach the target value. However, if the input amount changes greatly, the controlled amount changes greatly in a short time; and therefore, there is a possibility that the controlled amount will surpass the target value. As a result, the controlled value would reciprocate the vicinity of the target value in a short period; thus, there is a possibility that vibration of the stage 5 is caused. In contrast, when the gain G1 of the stage control system 12 is small, the controlled amount changes only slightly, even with a large change in the input amount. Thus, the responsiveness of the stage control system 12 is lowered and will not be able to follow the high frequency changes. In the electron beam writing apparatus 1 of the present embodiment, the gain G1 of the stage control system 12 is variable.

The position information signal S1 of the stage 5 measured by the laser length measurement device 11 is also provided to an electron beam tracking control system 13 (hereinafter described as "tracking control system") provided in the controller 200. The tracking control system 13 provides a deflection signal S3 based on the position information signal S1 of the stage 5 (more specifically based on velocity information obtained from the position information signal S1) to a deflector 91 of the electronic optical system 9 when writing on a writing area by the electron beam 3. By such a configuration, the electron beam 3 can be positioned to a predetermined position of the mask substrate in association with the movement of the stage 5 (in other words, movement of the mask substrate 4). Further, during the time when the electron beam 3 is irradiated to the mask substrate 4, the tracking control system 13 corrects the writing position to a correct position based on a difference (tracking error) between the writing position (position of the electron beam 3 irradiated on the mask substrate 4) and the position information signal S1 for the actual position of the stage 5 obtained by the laser length measurement device 11. The tracking control system 13 achieves the correction by providing the deflection signal S3, which makes the difference between the actual-position information signal S1 of the stage 5 and the writing position zero, to the deflector 91. Such control by the tracking control system 13 is called a "tracking correction." The error between the irradiation position of the electron beam 3 and the correct writing position on the mask substrate 4 can be suppressed to a certain extent by the tracking correction. However, it is not always the case that all variations of the relative position between the electron beam 3 and the mask substrate 4 (stage 5), triggered by the vibration, can be completely corrected by the tracking correction. For example, the variation of the relative position between the electron beam 3 and the mask substrate 4 caused by the vibrations from the chamber, stage or optical column is difficult to suppress by the tracking correction. Further, if the component itself that configures the laser length measurement system (for example, a laser light source, a mirror provided on the stage for reflecting the laser, a light receiver for detecting the laser light reflected on the mirror) carries a mechanical failure, such as a loose attachment or deformation, there will be an error in the measured position information of the stage 5 as discussed above. Therefore, it is difficult to correct the error between the irradiation position of the electron beam 3 and the writing position on the mask substrate 4 caused by such mechanical failure by the tracking correction.

As mentioned above, in the electron beam writing apparatus 1, it is necessary to suppress the vibration of the apparatus causing an error between the irradiation position of the electron beam 3 and the writing position on the mask substrate 4. The electron beam writing apparatus 1 further comprises various vibration control mechanisms for suppressing vibration of the apparatus. FIG. 1 shows an example of such vibration control mechanisms.

The electron beam writing apparatus 1, for example, comprises an air suspension 15 between a pedestal 14 and the chamber 7. The air suspension 15 is a suspension using compressed air. The chamber 7 and the pedestal 14 are attached with respective vibration sensors 71 and 141. The vibration sensor 71 generates a chamber vibration signal S4 in accordance with the vibration of the chamber 7. The vibration sensor 71 sends the signal S4 to a chamber vibration control feedback system 16 provided in the controller 200. The vibration sensor 141 generates a pedestal vibration signal S5 in accordance with the vibration of the pedestal 14 and sends the signal S5 to the chamber vibration control feedback system 16. The location on the chamber 7 where the vibration sensor 71 is provided or the number of vibration sensors 71 may be suitably selected. All vibration sensors 141 may be attached to the all pedestals 14. In addition, the vibration sensors 71 and 141 may each be a position sensor, a velocity sensor or an acceleration sensor. The chamber vibration control feedback system 16 may be configured to convert the signals S4 and S5 sent from the vibration sensors 71 and 141 into vibration information depending on the type of the signals S4 and S5. The vibration sensors 71 and 141 may be a single axis sensor, multi-axis sensor, such as a triaxial sensor, or an omni-directional sensor. Further, the electron beam writing apparatus 1 may comprise a control system using a piezoelectric actuator for vibration control of the chamber 7.

The chamber vibration control feedback system 16 generates an air servo valve control signal S6 so that pressurized air in the air suspension 15 is supplied and discharged in accordance with the chamber vibration signal S4 and pedestal vibration signal S5, detected by the vibration sensors 71 and 141. The air servo control signal S6 is sent to an air servo valve 17. The air servo valve 17 exchanges the pressurized air with the air suspension 15 via an air path Air according to the air servo valve control signal S6. The supply and discharge of the pressurized air for the air suspension 15 by the air servo valve 17 follow an opposite phase from the Z-direction movement of the chamber 7. The air path Air is provided with a valve; however, the explanation will be omitted for simplification purposes. In the electron beam writing apparatus 1 according to the present embodiment, a gain G3 of the chamber vibration control feedback system 16 is set to be smaller so as not to significantly respond to the vibration of the pedestal 14. Therefore, since the responsiveness of the chamber vibration control feedback system 16 using the air servo valve 17 is low, the chamber vibration control feedback system 16 may suitably suppress a vibration of several ten Hz (Hertz) in the chamber 7.

In addition, the electron beam writing apparatus 1 of the present embodiment comprises one or more active vibration control mechanisms 18, each extending from the optical column 8 to the chamber 7, as a vibration control mechanism for suppressing the vibration of, for example, the optical column 8. The active vibration control mechanisms 18, for example, extend in three or four directions from the periphery of the optical column 8. Each of the active vibration control mechanisms 18 comprises arms 181 and a piezoelectric actuator 182 which bridges the space between the arms 181. The optical column 8 has a vibration sensor 81 for detecting vibration of the optical column 8. The vibration sensor 81 generates an optical column vibration signal S7 depending on the vibration of the optical column 8 and sends the signal S7 to an optical column vibration control feedback system 19 provided in the controller 200. The optical column vibration control feedback system 19 sends an optical column vibration control signal S8 to the piezoelectric actuator 182 of the active vibration control mechanism 18 in order to expand and contract the piezoelectric actuator 182 depending on the optical column vibration signal S7. The piezoelectric actuator 182 suppresses the vibrations caused at the optical column 8 by expanding and contracting in an opposite phase from the vibration of the optical column 8. The position where the vibration sensor 81 is provided for the optical column 8 and the number of vibration sensors 81 can be suitably selected. In addition, the vibration sensor 81 may be a position sensor, a velocity sensor or an acceleration sensor. The optical column vibration control feedback system 19 may be configured to convert the signal S7 into vibration information depending on the type of the signal S7 sent from the vibration sensor 81. The vibration sensor 81 may be a single axis sensor, a multi-axis sensor, such as a triaxial sensor, or an omni-directional sensor. The piezoelectric actuator 182 has good frequency responsiveness. Thus, the optical column vibration control feedback system 19 can suppress a vibration of several hundred Hz (Hertz) in the optical column 8.

Further, the stage control system 12, electron beam tracking control system 13, chamber vibration control feedback system 16 and optical column vibration control feedback system 19 comprised by the controller 200 may each be configured from a hardware circuit. The stage control system 12, electron beam tracking control system 13, chamber vibration control feedback system 16, and optical column vibration control feedback system 19 may each be a configuration including an analog-digital converter for converting an input amount to a digital value; a CPU (microprocessor or a computer device) for processing the digitized input amount; and a digital-analog converter for converting a digital controlled amount that is output by the CPU into an analog signal. The CPU stores a transfer function indicating the relationship between an input amount and a controlled amount as a software program or a table. The CPU can output a suitable controlled amount depending on the input amount by executing the software program or referring to the table.

The electron beam writing apparatus 1 of the present embodiment has the feature of detecting mechanical failures in the electron beam writing apparatus 1 by providing a simulation vibration to a predetermined position of the electron beam writing apparatus 1, in a state where the stage 5 is stationary in a predetermined position. Thus, in the electron beam writing apparatus 1 of the present embodiment, the controller 200 comprises an excitation vibration analysis unit 20 for analyzing vibrations caused at portions of the apparatus 1 in response to a vibration applied to a given portion of the apparatus 1. The excitation vibration analysis unit 20 may be configured to receive digitized input data. It may also be configured with a CPU (microprocessor or computer device) for performing a predetermined process to the input data by executing the software.

The excitation vibration analysis unit 20 is configured to send instructions including information such as parts to vibrate, amplitude of vibration (intensity of vibration), direction of vibration (for example, X-direction or Y-direction), and range of the vibration frequency, using a signal S9 to an excitation signal generator 21. In the electron beam writing apparatus 1 of the present embodiment, the controller 200 comprises the excitation signal generator 21 configured to output excitation signals S10, S11 and S12, which are sine wave signals of a predetermined amplitude and frequency. The excitation signal generator 21 may be of a frequency scanning type, and may output excitation signals sweeping a frequency area of a predetermined range. The excitation signal generator 21 may be configured by software executable by a CPU. Alternatively, a waveform generator may be (for example, a programmable frequency scan generator) capable of setting a start frequency, step size for changing the frequency, duration for outputting each frequency, and so on. The excitation vibration analysis unit 20 may receive, through the signal S9, frequency information of the currently output excitation signal from the excitation signal generator 21.

In the electron beam writing apparatus 1 of the present embodiment, the excitation signals S10, S11, and S12 from the excitation signal generator 21 respectively provide vibrations to the stage 5, optical column 8 and chamber 7. The excitation signal generator 21 may be configured to provide a simulation vibration to at least one of the various structural elements (including at least the stage 5, optical column 8, and chamber 7) of the electron beam writing apparatus 1 in accordance with instructions from the excitation vibration analysis unit 20 provided in the controller 200. The excitation signals S10, S11 and S12 output from the excitation signal generator 21 are provided to the actuators respectively provided on the stage 5, optical column 8, and chamber 7 in order to cause vibrations on the stage 5, optical column 8 and chamber 7. In the electron beam writing apparatus 1 of the present embodiment, the stage 5 comprises the motor 61 for the drive mechanism 6; the optical column 8 comprises the piezoelectric actuator 182 for the active vibration control mechanism 18; and the chamber 7 comprises the air servo valve 17 for the air suspension 15. The motor 61, the piezoelectric actuator 182, and the air servo valve 17 are used as the actuators for causing vibrations in the stage 5, the optical column 8 and the chamber 7. Thus, the excitation signals S10, S11 and S12 output from the excitation signal generator 21 are respectively input to the motor 61, the piezoelectric actuator 182, and the air servo valve 17. For example, when the sine wave excitation signal S10 of a certain frequency fHz (hertz) is applied to the motor 61 for the drive mechanism of the X-stage 51, the motor 61 repeats micro forward and backward rotations at a cycle T (=1/f) sec. The repetition of forward and backward rotations of the motor 61 cause repeated micro forward and backward motions of the X-stage 51 along the X-direction which lead to the vibration of the stage 5. The frequency of the vibration substantially matches with the frequency fHz (hertz) of the excitation signal S10. The excitation signal generator 21 changes the frequency fHz (hertz) of the excitation signal S10, for example, from 0 Hz (hertz) to 2000 Hz (hertz). By applying the excitation signal S10 to the motor for the drive mechanism of the Y-stage 52, the Y-direction vibrations of the Y-stage 52 can be similarly excited. In addition, the excitation signal generator 21 changes the amplitude of the excitation signal S10 based on the instruction for the vibration amplitude (intensity of the vibration) from the excitation vibration analysis unit 20. The excitation signal S10 may be provided to one or more of the drive mechanism 6 of the X-stage 51, the drive mechanism of the Y-stage 52, and the drive mechanism of the Z-stage. For example, excitement of the stage 5 at 20 Hz (hertz) would involve simulation of a 20 Hz (hertz) vibration having occurred at the stage 5 by the acceleration and deceleration (acceleration movement) of the stage 5. The excitation signal generator 21, as with the excitation signal S10, outputs the excitation signals S11 and S12 to the piezoelectric actuator 182 and the air servo valve 17.

Note that the excitation vibration analysis unit 20 and the excitation signal generator 21 constituting the controller 200 may be provided separately outside the electron beam writing apparatus 1. In this case, the excitation vibration analysis unit 20 and the excitation signal generator 21 receive predetermined input signals, such as the signals S1, S4, S7, S14, and S15, from the electron beam writing apparatus 1, and output predetermined output signals, such as the signals S10, S11 and S12, to the electron beam writing apparatus 1. In another implementation, a part or the whole of the controller 200 may be provided separately outside the electron beam writing apparatus 1 so that the electron beam writing apparatus 1 can be controlled from the outside.

A mark 221 is provided on a mark stand 22 fixed to the stage 5. The mark 221 is used for detecting a relative movement between the electron beam 3 and the stage 5. The mark 221 may be formed from a heavy metal film, such as tungsten (W) or gold (Au), laminated on a silicon substrate. The mark 221 may, for example, have a rectangular shape. The outline of the rectangular mark 221 forms a knife edge. A backscatter coefficient to incident electrons is larger for tungsten than silicon. Thus, a contrast in intensity of the reflected electron (or secondary electron) is caused between when the electron beam 3 irradiates the tungsten mark 221 and when the electron beam 3 irradiates the silicon substrate. The electron beam writing apparatus 1 of the present embodiment comprises an electron detector 23 for detecting reflection electrons from the mark 221. The reflection electron detection signal S13 output by the electron detector 23 is input to a beam vibration detector 24.

Figure 2:
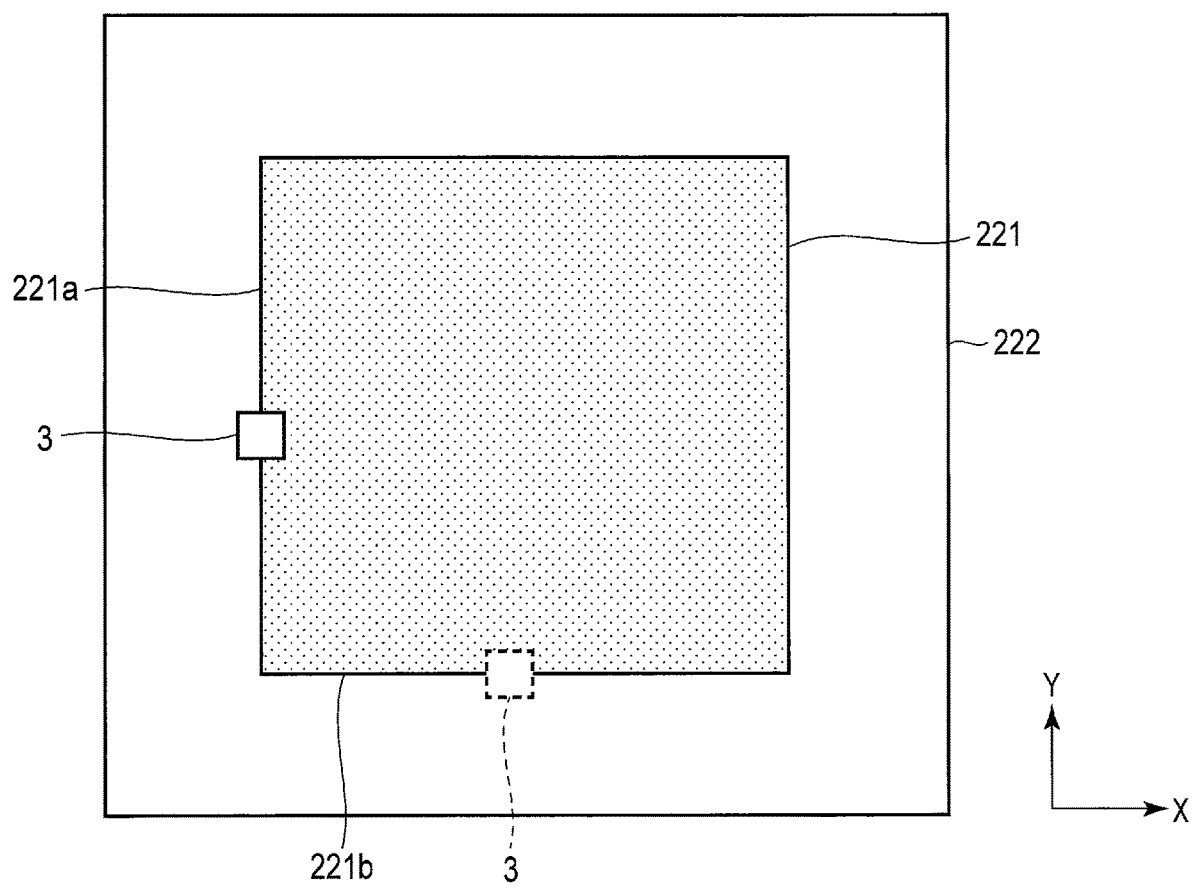
FIG. 2 is a schematic view of a mark used for detecting a relative vibration between an electron beam and a stage in the electron beam writing apparatus according to one embodiment.

FIG. 2 schematically shows a relationship between the mark 221 and the electron beam 3. The rectangular mark 221 is formed by, for example, a tungsten film on a silicon substrate 222. The mark 221 comprises a knife edge 221a for detecting relative displacement in the X-direction between the electron beam 3 and the stage 5, and a knife edge 221b for detecting relative displacement in the Y-direction between the electron beam 3 and the stage 5. For example, when detecting the relative displacement between the electron beam 3 and the stage 5, the rectangular-shaped electron beam 3 is aligned with the knife edge 221a of the mark 221. When the relative position between the electron beam 3 and the stage 5 changes in the X-direction so that the electron beam 3 irradiates the inner side of the mark 221, the amount of electrons detected by the electron detector 23 increases.

In contrast, when the relative position between the electron beam 3 and the stage 5 changes in the X-direction so that the electron beam 3 irradiates the outer side of the mark 221, the amount of electrons detected by the electron detector 23 decreases. Therefore, the change in intensity of the reflection electron detection signal S13 output by the electron detector 23 indicates a change in the relative position between the electron beam 3 and the stage 5 in the X-direction. When the irradiation position by the electron beam 3 sways (vibrates temporally) in the X-direction, the beam vibration detector 24 detects such a vibration as a temporal change of intensity of the reflection electron detection signal S13. The Y-direction vibration of the electron beam 3 are similarly detected. A beam vibration signal S14 detected by the beam vibration detector 24 is sent to a hereinafter-described frequency analysis unit 25 provided at the controller 200. The mark 221 may be suitably selected from various patterns, such as a line-and-space-pattern, a cross pattern etc. Further, capturing electrons reflected at the mark 221 by the electron detector 23 is one example of the method of detecting a change (vibration) of the relative position. More specifically, a change of the relative position can be detected by detecting electrons which pass a predetermined opening. The shape of the electron beam 3 is suitably selected from various shapes, such circular shapes. In addition, when multiple marks 221 are placed at various positions on the stage 5, the vibration of the relative position between the electron beam 3 and the stage 5 can be detected while the stage 5 is located at various positions.

In the electron beam writing apparatus 1 of the present embodiment, the beam vibration signal S14 generated by the beam vibration detector 24, the position information signal S1 output from the laser length measurement device 11 during a predetermined time, the signal S4 from the vibration sensor 71 attached to the chamber 7, and the signal S7 from the vibration sensor 81 attached to the optical column 8 are applied to the frequency analysis unit 25 provided at the controller 200. The frequency analysis unit 25 converts each input signal (signals S1, S4, S7 or S14) in the time domain into a vibration frequency signal S15 in the frequency domain and outputs it to the excitation vibration analysis unit 20. In other words, the vibration frequency signal S15 indicates a frequency component of a vibration of the relative position between the electron beam 3 and the mark 221, a vibration of the position information signal S1 output by the laser length measurement device 11, a vibration of the optical column 8, or a vibration of the chamber 7. The frequency analysis unit 25 may be configured by Fast Fourier Transform (FFT) software executable by the CPU. Further, the frequency analysis unit 25 may be an individual apparatus, such as a FFT analyzer. In addition, the frequency analysis unit 25 along with the excitation vibration analysis unit 20 or the excitation signal generator 21, assumed to be included in the controller 200, may be provided separately outside the electron beam writing apparatus 1. In this case, the frequency analysis unit 25 receives predetermined input signals, such as the signals S1, S4, S7 and S14, from the electron beam writing apparatus 1 and provides the vibration frequency signal S15 to the excitation vibration analysis unit 20.

The excitation vibration analysis unit 20 determines that a vibration has been caused in the relative position between the electron beam 3 and the stage 5 by the frequency vibration applied to the stage 5, optical column 8 or chamber 7, based on the information in the vibration frequency signal S15 that indicates the frequency component of the beam vibration signal S14. In other words, the excitation vibration analysis unit 20 determines whether a vibration for causing the relative position of the electron beam 3 to vibrate has occurred in any of the structural elements of the electron beam writing apparatus 1 due to the excitation. In addition, the excitation vibration analysis unit 20 determines the part whose vibrations are responsible for causing the vibration of the relative position of the electron beam 3, based on the frequency component of the vibration of the relative position of the electron beam 3 and the frequency component of the vibration detected in each part.

In the detection of a mechanical failure in the electron beam writing apparatus 1, the excitation vibration analysis unit 20 provides a target position information signal S16 to the stage control system 12 for moving the stage 5, so that the mark 221 will be located directly under the optical column 8. The stage control system 12 moves the stage 5 to a target position by controlling the drive mechanism 6 based on the position information signal S1 of the stage 5 obtained by the laser length measurement device 11. In addition, the stage control system 12 controls the drive mechanism 6 based on the position information signal S1 of the stage 5 so that the stage 5 remains in the target position. For example, in the electron beam writing apparatus 1 of the embodiment which uses the mark 221 and electron detector 23 as shown in FIGS. 1 and 2, the excitation vibration analysis unit 20 controls the electron beam tracking control system 13 using signal S17 so that the center of the electron beam 3 will be positioned on the knife edge 221a or 221b of the mark 221. The electron beam tracking control system 13 controls the deflector 91 based on a position information signal S18 of the electron beam 3 obtained from the beam vibration detector 24 in order to position the electron beam 3 on the mark 221.

Figure 3B:
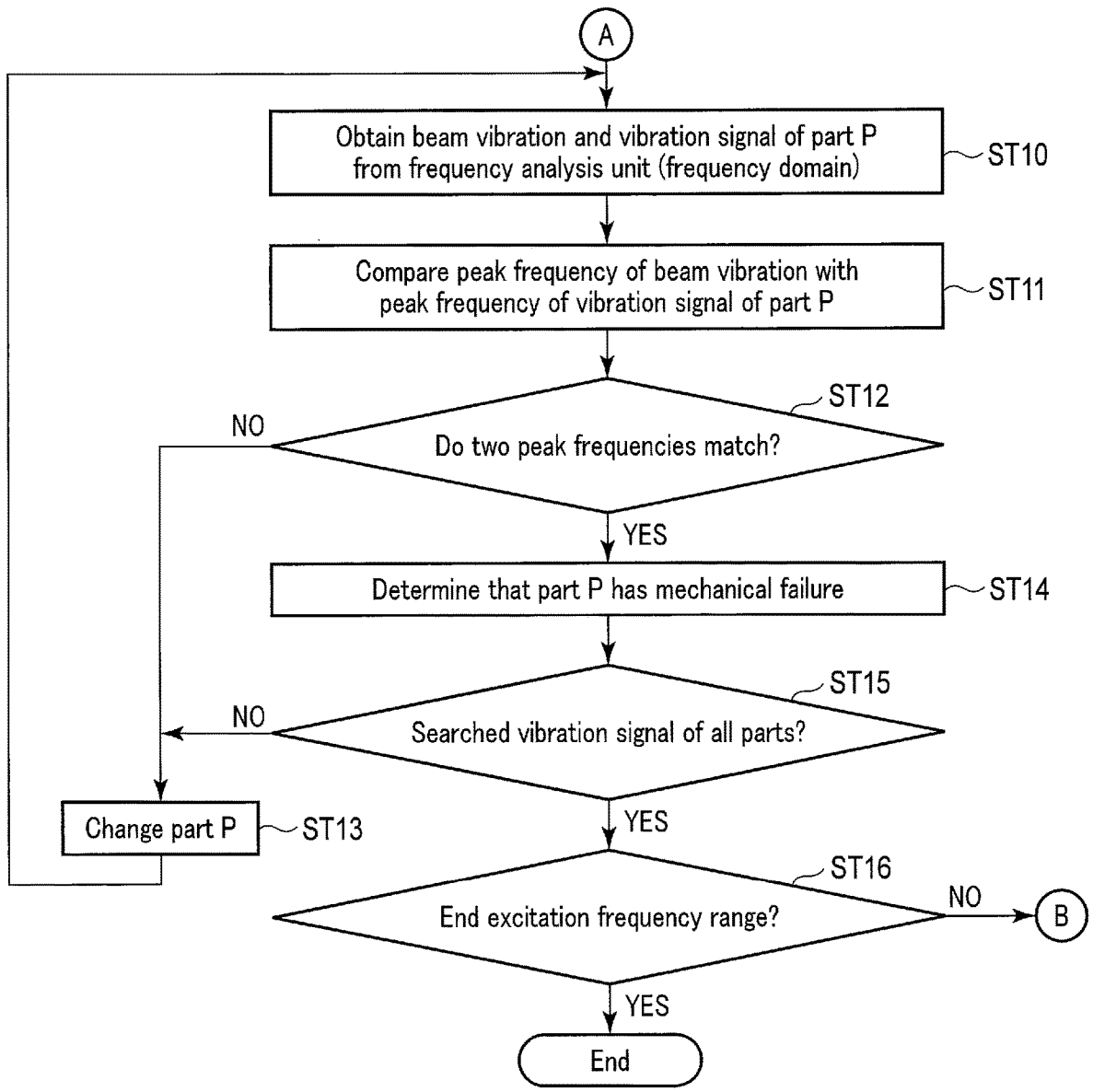
FIG. 3B is a flowchart indicating a flow of operation for detecting a presence of a mechanical failure within the electron beam writing apparatus according to one embodiment.

FIGS. 3A and 3B are flowcharts indicating a flow of operation executed by the excitation vibration analysis unit 20 for detecting a presence of a mechanical failure within the electron beam writing apparatus 1 according to one embodiment.

First of all, steps ST1 to ST9 are explained by referring to FIG. 3A.

The excitation vibration analysis unit 20, for example, starts mechanical failure detection processing in response to receiving instructions from an operator of the electron beam writing apparatus 1.

[ST1]

In step 1, when the mechanical failure detection processing starts, the excitation vibration analysis unit 20 positions the electron beam 3 on the mark 221 by using the stage control system 12 and electron beam tracking control system 13. The explanation about the detailed processing has been already provided above, and will therefore be omitted.

[ST2]

Next, in step ST2, the excitation vibration analysis unit 20 instructs the excitation signal generator 21 to, at least for a part of the electron beam writing apparatus 1, apply the excitation signal, direction of the excitation signal, amplitude of the excitation signal, and frequency range of the excitation signal. In the electron beam writing apparatus 1 of the present embodiment, the part to which to apply a vibration is selected from the stage 5, optical column 8 and chamber 7. For the excitation signal, the frequency range for the excitation signal generator 21 to scan is set to a range of, for example, 0 Hz (hertz) to 2000 Hz (hertz). Since the responsiveness of the system formed of the air suspension 15 and air servo valve 17 and used for applying a vibration to the chamber 7 is low, the frequency range of the excitation signal is preferably from 0 Hz (hertz) to several ten Hz (hertz) (for example, 20 Hz (hertz)). The vibration to be applied to the optical column 8 is preferably in the range of 0 Hz (hertz) to several hundred Hz (hertz) (for example, 100 Hz). The excitation vibration analysis unit 20 may be configured so that the excitation state including a part to be excited, excitation direction, amplitude of the excitation signal, and frequency range of the excitation signal is set by an operator of the electron beam writing apparatus 1.

As mentioned above, a mechanical failure is unlikely to affect the variation of the relative position between the charged particle beam and the sample when there is no movement that will affect the failure part in the electron beam writing apparatus 1 (referred to as "static state" of the electron beam writing apparatus 1) (for example, the state where the stage 5 remains in a predetermined position or a state where the stage 5 is moving at a constant velocity). When the force created by the acceleration movement of the stage 5 or the force created by the vibration of the chamber 7 or the optical column 8 affects the part with a mechanical failure, the vibration of the relative position between the electron beam 3 and the stage 5 is caused by the trembling or rattling of such a part with a mechanical failure (referred to as "active status" of the electron beam writing apparatus 1). Therefore, it is unlikely to detect a mechanical failure in the structural element of the electron beam writing apparatus 1 when the electron beam writing apparatus 1 is in the static state. The electron beam writing apparatus 1 according to the present embodiment is characterized by its simulating the active state of the electron beam writing apparatus 1 by causing vibrations in the predetermined structural element that would affect failure parts.

[ST3]

In step ST3, the process is branched depending on the part (stage 5, optical column 8, or chamber 7) to be applied with a vibration. For applying a vibration to the stage 5, the excitation signal generator 21 provides the excitation signal S10 to the motor 61. For applying a vibration to the optical column 8, the excitation signal generator 21 provides the excitation signal S11 to the piezoelectric actuator 182. For applying a vibration to the chamber 7, the excitation signal generator 21 provides the excitation signal S12 to the air servo valve 17. The following processing will be explained assuming an example in which the application of vibrations to the stage 5 is selected. Similar processing will be performed when selecting for a vibration to be applied to the optical column 8 or the chamber 7.

[ST4]

The excitation vibration analysis unit 20 instructs the excitation signal generator 21 to start excitation in step ST4. The excitation signal generator 21 applies the excitation signal S10 to the motor 61 of the drive mechanism 6. For example, when the frequency range of the vibration applied to the stage 5 is set to be 0 Hz (hertz) to 2000 Hz (hertz), the initial frequency fi (i=0) of the excitation signal S10 is 0 Hz (hertz) (in other words, the vibration does not occur to the stage 5).

[ST5]

In step ST5, the excitation vibration analysis unit 20 obtains information of the frequency (initially, f0=0 Hz) of the excitation signal S10 currently applied to the motor 61 from the excitation signal generator 21.

[ST6]

Next, in step ST6 the excitation vibration, analysis unit 20 receives the vibration frequency signal S15 indicating the frequency component of the beam vibration signal S14 (indicating the vibration of the relative position between the electron beam 3 and mark 221) generated by the beam vibration detector 24, from the frequency analysis unit 25.

[ST7]

In step ST7, the excitation vibration analysis unit 20 detects whether or not there is a frequency component with a large peak in the magnitude of vibration within the beam vibration signal S14 based on the vibration frequency signal S15. This corresponds to the determination of whether an anomalous vibration has been caused or otherwise in the relative position between the electron beam 3 and the mark 221 (in other words, in the stage 5). In the initial state where vibrations are not applied to the stage 5 (f0=0 Hz), if a frequency component with a peak is found in the beam vibration signal S14, the excitation vibration analysis unit 20 detects that the vibration at the relative position between the electron beam 3 and the mark 221 is caused due to a reason other than the vibration of the stage 5. For simplification purpose, such detection is not shown in FIG. 3A.

FIG. 4 shows an example of the vibration frequency signal S15 which converts the beam vibration signal S14 into a frequency domain. In FIG. 4, the horizontal axis represents a frequency (Hz (hertz)), and the vertical axis represents a magnitude of the vibration. FIG. 4 shows a frequency component of the beam vibration signal S14 when excitation is not applied to the stage 5 by the excitation vibration analysis unit 20. As shown in FIG. 4, there is no large peak in the magnitude of vibration at any frequency. However, the frequency area below approximately 200 Hz (hertz) has small inherent vibrations. Such inherent vibrations may be caused by, for example, vibrations resulting from servo control for keeping the stage 5 at a predetermined position, vibrations resulting from a vacuum pump of the exhaust mechanism 10, etc.

[ST8]

Step ST8 will be explained by referring back to FIG. 3A.

When it is determined that there is no peak in the frequency component of the beam vibration signal S14 in step ST7 (ST7, No), the excitation vibration analysis unit 20 instructs the excitation signal generator 21 to update the frequency of the excitation signal S10 in step ST8 (for example, f1=5 Hz). The process of the excitation vibration analysis unit 20 returns to step ST5.

[ST9]

In step ST7, when it is determined that the frequency component of the beam vibration signal S14 has a peak in step ST7 (ST7, YES), the excitation vibration analysis unit 20 detects mechanical failures in any of the structural components in step ST9.

More specifically, when it is determined in step ST7 that the beam vibration signal S14 involves a frequency component with a peak in response to vibrating the stage 5 using the excitation signal S10 of a frequency fi (i=1)=5 Hz (ST7, YES), the excitation vibration analysis unit 20 detects in step ST9 that a vibration has been caused in any of the structural components of the electron beam writing apparatus 1 by the 5 Hz (hertz) vibration applied to the stage 5, and thereby the relative position between the electron beam 3 and the stage 5 has been vibrated. This would mean that any one of the structural components has a mechanical failure that can be affected by the 5 Hz (hertz) vibration of the stage 5. Applying the 5 Hz (hertz) vibration to the stage 5 is a simulation of a 5 Hz (hertz) vibration occurrence in the stage 5 by the acceleration movement of the stage 5. Thus, the detection result would mean that vibration of the relative position between the electron beam 3 and the mask substrate 4 is likely to occur by the acceleration movement of the stage 5 during the pattern writing to the mask substrate 4.

The operator of the electron beam writing apparatus 1 can recognize that any of the structural components of the electron beam writing apparatus 1 possesses a mechanical failure through notification (for example, via display view) from the excitation signal analysis unit 20.

FIG. 5 shows a frequency component of the beam vibration signal S14 when excitation by the excitation vibration analysis unit 20 is performed. In FIG. 5, the horizontal axis represents a frequency (Hz (hertz)) of the vibration, and the vertical axis represents a magnitude of the vibration. FIG. 5 indicates that a vibration peak has occurred in the approximately 200 Hz (hertz) frequency when a predetermined frequency vibration is applied to the stage 5 by the excitation vibration analysis unit 20. Since the aforementioned inherent vibrations also exist, the excitation vibration analysis unit 20 may determine a vibration larger than a predetermined threshold to be a peak.

Based on the determination that there is a mechanical failure in any of the structural components of the electron beam writing apparatus 1 in step ST9, the excitation vibration analysis unit 20 executes steps ST10 to ST16 shown in FIG. 3B. The process of steps ST10 to ST16 is performed to determine which structural component of the electron beam writing apparatus 1 possesses the mechanical failure.

[ST10]

The process of steps ST10 to ST16 is explained using FIG. 3B.

In step ST10, the excitation vibration analysis unit 20 receives the vibration frequency signal S15 corresponding to the vibration detected at any of the structural components of the electron beam writing apparatus 1, from the frequency analysis unit 25. In the example shown in FIG. 1, the excitation vibration analysis unit 20 selectively receives the vibration frequency signal S15 indicative of the frequency component of any vibration of the vibration of the position information signal S1 of the stage 5 measured by the laser length measurement device 11, the vibration of the chamber 7 detected by the vibration sensor 71, and the vibration of the optical column 8 detected by the vibration sensor 81, from the frequency analysis unit 25. For example, the excitation vibration analysis unit 20 selects the vibration of the position information signal S1 (called "vibration of part P (stage 5, chamber 7 or optical column 8)") detected by the laser length measurement device 11, and obtains the vibration frequency signal S15 indicating the frequency component of the vibration of part P from the frequency analysis unit 25.

[ST11]

In step ST11, the excitation vibration analysis unit 20 analyzes whether or not the vibration frequency signal S15 for the vibration of part P, received from the frequency analysis unit 25, has a vibration peak at substantially the same frequency as the peak frequency of the beam vibration signal S14 obtained using the frequency analysis unit 25. In other words, the excitation vibration analysis unit 20 compares the peak frequency of the beam vibration with the peak frequency of the vibration of part P.

[ST12]

In step ST12, the excitation vibration analysis unit 20 determines whether or not the peak frequency of the beam vibration and the peak frequency of the vibration of part P substantially conform to each other.

[ST13]

If it is determined in step ST12 that the peak frequency of the beam vibration and the peak frequency of the vibration of part P do not match (ST12, NO), the excitation vibration analysis unit 20 in step ST13 changes part P for detecting the vibration (for example, to the chamber 7 or optical column 8) and returns to the process of step ST10.

[ST14]

If it is determined in step ST12 that the peak frequency of beam vibration matches with the peak frequency of the vibration of part P (ST12, YES), the excitation vibration analysis unit 20 in step ST14 detects that the mechanical failure is present in part P where the vibration is detected (for example, the laser length measurement device 11). The excitation vibration analysis unit 20 notifies this detection result to the operator of the electron beam writing apparatus (for example, via display view). The operator may perform procedures such as repairs and exchanges for the part P notified as having a mechanical failure.

[ST15]

Then, in step ST15, the excitation vibration analysis unit 20 determines whether or not the analyses of the vibration signals from all the parts (for example, the signals S1, S4, and S7 of FIG. 1) have been completed. If the analyses of the vibration signals from all the parts (for example, the signals S1, S4, and S7 in FIG. 1) have not ended (ST15, NO), the process returns to step ST13 and part P will be changed.

[ST16]

If the analyses of the vibration signals from all the parts (for example, the signals S1, S4, and S7 in FIG. 1) have ended in step ST15 (ST15, YES), the excitation vibration analysis unit 20 determines whether or not the scanning of the frequency range set by the excitation analysis unit 20 has ended for the excitation signal S10, S11 or S12.

If the scanning of the frequency range has not ended (ST16, NO), the excitation vibration analysis unit 20 returns to step ST8 (FIG. 3A) and performs vibration analysis with the excitation of the next frequency fi (i=i+1). The excitation vibration analysis unit 20 ends the process if the scanning of the frequency range has been completed (ST16, YES).

The parts for detecting vibrations are not limited to the output of the position information of the stage 5 from the laser length measurement device 11, the vibration sensor 71 of the chamber 7, and the vibration sensor 81 of the optical column 8. For example, a vibration sensor may be attached to the pipes of the exhaust mechanism 10.

As a result of the excitation vibration analysis unit 20 performing the aforementioned steps ST1 to ST16, it is possible to detect (a) any parts of the electron beam writing apparatus 1 having a mechanical failure, and (b) which of the structural elements of the electron beam writing apparatus 1 has the mechanical failure, without actually writing a pattern on the mask substrate 4.

For example, suppose that the X-stage 51 is applied with a vibration using the excitation signal S10 of a certain frequency. In that case, the excitation vibration analysis unit 20 detects that the beam vibration signal S14 indicating the vibration of the electron beam 3 with respect to the mark 221 has a component with a large peak in gHz (hertz). Further, the excitation vibration analysis unit 20 detects that the vibration of the position information signal S1 from the laser length measurement device 11 in the X-direction has a component with a large peak in the same gHz (hertz). There is a correlation between the frequencies of the vibration of the electron beam 3 and the vibration of the position information signal S1 from the laser length measurement device 11. Thus, the excitation vibration analysis unit 20 detects that the mechanical failure (e.g., loosened attachment of the mirror 111 or interferometer 112, or distortion of a part of the chamber 7 where the interferometer 112 is attached) of the structural components of the laser length measurement device 11 in the X-direction is the cause of the vibration of the electron beam 3.

Alternatively, suppose that a vibration is applied to the optical column 8 by the excitation signal S11 at a certain frequency. In that case, the excitation vibration analysis unit 20 detects that the vibration of the electron beam 3 with respect to the mark 221 has a component with a large peak in the hHz (hertz). The excitation vibration analysis unit 20 detects that the vibration detected by the vibration sensor 81 of the optical column 8 has a component with a large peak in the same hHz (hertz). There is a correlation between the frequencies of the vibration of the electron beam 3 and the vibration of the optical column 8. Thus, the excitation vibration analysis unit 20 determines that the cause of the vibration of the electron beam 3 is a mechanical failure in the structural components of the optical column 8 or the active control mechanism 18 of the optical column 8.

The excitation vibration analysis unit 20 may be a semiconductor integrated circuit, such as a microprocessor, or a calculator, such as a personal computer. The process of the aforementioned steps ST1 to ST16 may be implemented by the electron beam writing apparatus 1 using a software program executable by the integrated circuit or calculator. In addition, the electron beam writing apparatus 1, aside from those shown in FIG. 1, may comprise a transfer mechanism for transferring the mask substrate 4, while maintaining a vacuum inside the chamber 7, to the stage 5 and transferring the mask substrate 4 written with a pattern out of the chamber 7.

As explained above, the electron beam writing apparatus 1 according to the present embodiment does not need to observe the pattern actually written to the mask substrate 4 for the detection of a mechanical failure in the structural elements. Thus, with the electron beam writing apparatus 1 according to the present embodiment, the detection of a mechanical failure in the structural element is easily performed in a short time without needing the time for writing a pattern on the mask substrate 4 and developing the mask substrate 4 written with the pattern.

Further, with the electron beam writing apparatus 1 according to the present embodiment, the time needed for maintenance of the electron beam writing apparatus 1, such as repairs and component exchange, can be shorted since the mechanical failure parts that would cause the vibration of the relative position between the electron beam 3 and the mask substrate 4 during the writing operation can be specified.

Modification Example

In the electron beam writing apparatus 1 according to the foregoing embodiment, the mechanical failure of part P is determined to be a cause of the relative vibration of the electron beam 3, based on the match between the peak frequency of the relative vibration of the electron beam 3 and the peak frequency of the vibration of part P.

This determination may instead be based on the match between the frequency of the excitation signal S10, S11, or S12 and the peak frequency of the vibration of part P. Further optionally, the determination may be based on the matching of three elements, namely, the frequency of the excitation signal S10, S11, or S12, the peak frequency of the relative vibration of the electron beam 3, and the peak frequency of the vibration of part P.

Second Embodiment

As discussed above, the gains G1, G2, and G3 as the values showing responsiveness of the controlled amount to the input amount for the respective stage control system 12, optical column vibration control feedback system 19, and chamber vibration control feedback system 16 are variable. When the gains G1, G2, and G3 are large, the controlled amount changes greatly even when the input amount changes slightly. When the controlled amount is attempted to be closer to the target value, there is a possibility that the controlled amount will exceed the target value since the controlled amount changes greatly over a short period of time with a large change in the input amount. As a result, the control for returning the controlled amount back to the target control will be repeated. This repetition of the control means repeated application of force to the control target (for example, stage 5, chamber 7 and optical column 8). Therefore, there is a possibility that the repetition of the control will cause a vibration in the control target. Thus, adjusting the gains G1, G2 and G3 of the stage control system 12, optical column vibration control feedback system 19 and chamber vibration control feedback system 16 will contribute to suppressing vibrations.

Suppose that, in the electron beam writing apparatus 1 according to the second embodiment, for example, the excitation vibration analysis unit 20 has detected that the cause of the vibration of the electron beam 3 is the mechanical failure in the structural component of the laser length measurement device 11 in the X-direction. In this case, the excitation vibration analysis unit 20 may attempt to suppress the relative vibrations of the electron beam 3 by adjusting the gain G1 of the stage control system 12 for controlling the X-stage 51. The excitation vibration analysis unit 20 can recognize the effect of adjusting the gain G1 by the process indicated in FIGS. 3A and 3B after adjusting the gain G1 of the stage control system 12.

As another instance, suppose that in the electron beam writing apparatus 1 according to the second embodiment, the excitation vibration analysis unit 20 has detected that the mechanical failure in the structural component of the optical column 8 or the active vibration control mechanism 18 of the optical column 8 is the cause of the vibration of the electron beam 3. In this case, the excitation vibration analysis unit 20 may attempt to suppress the relative vibrations of the electron beam 3 by adjusting the gain G2 of the optical column vibration control feedback system 19. The excitation vibration analysis unit 20 can recognize the effect of adjusting the gain G2 by the process indicated in FIGS. 3A and 3B after adjusting the gain G2 of the optical column vibration control feedback system 19.

The excitation vibration analysis unit 20 may determine whether or not the excitation vibration analysis unit 20 should perform adjustment of the gain G1, G2, or G3 based on the frequency component of the vibration in part P. Further, when the relative vibration of the electron beam 3 is not reduced even after the adjustment of the gains G1, G2, and G3 by the excitation vibration analysis unit 20, the excitation vibration analysis unit 20 may stop the adjustment of the gains G1, G2, and G3.

Further, when the stage control system 12, chamber vibration control feedback system 16, or optical column vibration control feedback system 19 comprises a filter for changing the responsiveness according to the frequency of an input signal, the excitation vibration analysis unit 20 may adjust the various coefficients of the filter instead of changing the adjustment of the gains G1, G2 and G3.

The electron beam writing apparatus 1 according to the second embodiment attempts to suppress the relative vibration of the electron beam 3 before repairing or exchanging a component with the mechanical failure specified as the cause of the relative vibration of the electron beam 3. If the relative vibration of the electron beam 3 can be suppressed by such attempt, there is no need to have the electron beam writing apparatus 1 on standby for the maintenance, such as for repair or replacement of the component having a mechanical failure.

Third Embodiment

In the electron beam writing apparatus 1 according to the third embodiment, the excitation vibration analysis unit 20 comprises a storage device.

The electron beam writing apparatus 1 of the third embodiment carries out a test where the excitation vibration analysis unit 20 performs the process shown in FIGS. 3A and 3B with a certain structural element in the electron beam writing apparatus 1 made to possess a mechanical failure. The excitation vibration analysis unit 20 stores the results of such tests in the storage device. The test will be performed by changing the part to be subjected to excitation of vibration, excitation direction, excitation magnitude, and excitation frequency. Further, the excitation vibration analysis unit 20 stores in the storage device by associating the information concerning the excitation, information concerning the relative vibration of the electron beam 3, information concerning the vibration in the part made to have a mechanical failure, upon detecting the relative vibration of the electron beam 3. The information concerning the excitation includes, for example, information of the excited part, excitation direction, excitation magnitude, and excitation frequency. The information concerning the relative vibration of the electron beam 3 includes, for example, information concerning the peak frequency and the magnitude of the relative vibration of the electron beam 3. The information concerning the vibration in the part made to have a mechanical failure includes, for example, information concerning the vibration peak frequency, vibration direction, and magnitude of the vibration.

In the third embodiment, during the inspection of the electron beam writing apparatus 1 by the process shown in FIGS. 3A and 3B, the excitation vibration analysis unit 20 refers to information of the test results stored in the storage device using the state of excitation when the relative vibration of the electron beam 3 is detected (for example, part, frequency, and direction) and the state of the relative vibration of the electron beam 3 (for example, peak frequency). By such, the excitation vibration analysis unit 20 can specify the part having a mechanical failure. If the state of the vibration detected in the specified part matches with the information concerning the vibration of the corresponding part stored in the storage device, the excitation vibration analysis unit 20 can determine the specified part with more certainty.

Alternatively, in the electron beam writing apparatus 1 according to the third embodiment, the excitation vibration analysis unit 20 may store the results from performance of the detection process indicated in FIGS. 3A and 3B as a history in the storage device.

In the electron beam writing apparatus 1 according to the third embodiment, the part having a mechanical failure is specified with more precision.

The present invention has been described using implementation examples of an electron beam writing apparatus. However, the present invention may be implemented as a charged particle beam apparatus by replacing the electron gun 2 of FIG. 1 with an emission source of a charged particle beam. In addition, the present invention is not limited to the charged particle beam writing apparatus according to the above embodiments and modifications, and various modifications are possible within the scope that does not exceed the gist of the invention. For example, it is possible to apply the invention to an inspection apparatus using a charged particle beam. In such a case, the target to which the charged particle beam is irradiated is a mask or wafer formed with a pattern. The inspection apparatus using a charged particle beam further comprises a mechanism for detecting charged particles either reflected from or passing through the object. In addition, the structural elements of the charged particle beam apparatus according to each embodiment and modification may be implemented in a suitable combination.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam apparatus, comprising:
a stage on which an object irradiated with a charged particle beam is to be placed, the stage being configured to move;
a chamber for storing the stage;
an emission source of the charged particle beam;
an electronic optical system configured to emit the charged particle beam from the emission source to the stage;
an optical column including the emission source and the electronic optical system;
a charged particle detector configured to detect a position of the charged particle beam irradiated from the electronic optical system;
a first actuator configured to provide a frequency vibration to the stage based on a first excitation signal;
a second actuator configured to provide a frequency vibration to the optical column based on a second excitation signal;
a third actuator configured to provide a frequency vibration to the chamber based on a third excitation signal; and
a controller configured to generate the first to the third excitation signals.

2. The charged particle beam apparatus according to claim 1, further comprising:
a vibration sensor configured to detect a vibration caused in at least one of the stage, the chamber, and the optical column.

3. The charged particle beam apparatus according to claim 2, wherein the controller is configured to determine a failure in one of the stage, the chamber, and the optical column based on:
a frequency of the excitation signals, and
a first vibration signal based on variation of the detected position of the charged particle beam, or a second vibration signal output by the vibration sensor.

4. The charged particle beam apparatus according to claim 3, further comprising:
a frequency analysis unit for analyzing a frequency of at least one of the first vibration signal and the second vibration signal,
wherein the controller is configured to obtain a peak frequency of at least one of the first vibration signal and the second vibration signal based on a result of the frequency analysis by the frequency analysis unit.

5. The charged particle beam apparatus according to claim 4, wherein the frequency analysis unit is configured to convert the first and second vibration signals in time domain into vibration frequency signals in frequency domain, and output the vibration frequency signals to the controller.

6. The charged particle beam apparatus according to claim 5, wherein the vibration frequency signals are indicative of a vibration of a relative position between the charged particle beam and a mark on the stage, or a frequency component of the vibration of the vibration sensor.

7. The charged particle beam apparatus according to claim 4, wherein the frequency analysis unit is Fast Fourier Transform (FFT) software executable by a CPU.

8. The charged particle beam apparatus according to claim 2, wherein the controller is configured to specify the stage, the chamber, or the optical column that involves a failure based on:
   a frequency of the excitation signals, and
   a first vibration signal based on variation of the detected position of the charged particle beam, or a second vibration signal output by the vibration sensor.

9. The charged particle beam apparatus according to claim 2, wherein the vibration sensor comprises:
   a laser length measurement device for detecting the vibration caused in the stage,
   a second vibration sensor for detecting the vibration caused in the chamber, and
   a third vibration sensor for detecting the vibration caused in the optical column.

10. The charged particle beam apparatus according to claim 9, wherein the second and third vibration sensors each are one of a single axis sensor, multi-axis sensor, and an omni-directional sensor.

11. The charged particle beam apparatus according to claim 9, wherein the laser length measurement device comprises:
   a mirror, and
   an interferometer for measuring a distance based on a phase of laser light reflected at the mirror.

12. The charged particle beam apparatus according to claim 1, wherein the first actuator for providing the vibration to the stage is configured to drive the stage for movement.

13. The charged particle beam apparatus according to claim 1, wherein the first to third actuators are configured to control vibrations of the stage, the chamber, and the optical column, respectively.

14. The charged particle beam apparatus according to claim 1, wherein the first actuator is a motor.

15. The charged particle beam apparatus according to claim 1, wherein the second actuator is a piezoelectric actuator.

16. The charged particle beam apparatus according to claim 1, wherein the third actuator is an air servo valve.

17. The charged particle beam apparatus according to claim 1, wherein the controller is configured to detect a mechanical failure in a part of one of the stage, the chamber, and the optical column where a vibration is detected, in response to determining that a peak frequency of the first vibration signal matches with a peak frequency of the vibration in one of the stage, the chamber, and the optical column.

18. The charged particle beam apparatus according to claim 1, wherein the chamber and the optical column form a sealed internal space.

19. The charged particle beam apparatus according to claim 18, further comprising:
   a vacuum pump for placing the internal space formed by the chamber and the optical column in vacuum.

20. The charged particle beam apparatus according to claim 1, wherein the optical column is directly or indirectly supported by the chamber.

* * * * *